INTEGRATED CIRCUIT MODULES

Filed July 19, 1965 4 Sheets-Sheet 1

INVENTORS
BERNARD L. KRAVITZ
HERBERT WINSKER
BY
Shenier & O'Connor
ATTORNEYS

INVENTORS
BERNARD L. KRAVITZ
HERBERT WINSKER
BY
Shenier & O'Connor
ATTORNEYS

INTEGRATED CIRCUIT MODULES

Filed July 19, 1965 4 Sheets-Sheet 3

INVENTORS
BERNARD L. KRAVITZ
HERBERT WINSKER
BY
Shenier & O'Connor
ATTORNEYS

INTEGRATED CIRCUIT MODULES

Filed July 19, 1965 4 Sheets-Sheet 4

INVENTORS
BERNARD L. KRAVITZ
HERBERT WINSKER
BY
Shenier & O'Connor
ATTORNEYS

United States Patent Office 3,370,203

Patented Feb. 20, 1968

3,370,203

INTEGRATED CIRCUIT MODULES

Bernard L. Kravitz, Forest Hills, and Herbert Winsker, Brewster, N.Y., assignors to United Aircraft Corporation, East Hartford, Conn., a corporation of Delaware Filed July 19, 1965, Ser. No. 473,023
9 Claims. (Cl. 317—101)

ABSTRACT OF THE DISCLOSURE

An integrated circuit module in which each of a stack of insulating frames of refractory material is provided with wall grooves for receiving the respective generally coplanar leads of a flat circuit package with the leads extending to the frame periphery. A plurality of frames together with a cover and a header are bonded in stacked relationship to form a hollow hermetic housing to a wall of which a conductive pattern is applied to connect said leads in a predetermined pattern.

Our invention relates to circuit component modules and more particularly to a three-dimensional integrated circuit module which does not require cast-encapsulation.

Integrated circuits in which active and passive circuits elements are deposited on or diffused into planar substrates are becoming increasingly important components in the electronics industry owing to their small size, potentially low cost and ruggedness in comparison with other miniature circuitry.

A particularly advantageous lead arrangement for integrated circuits known in the art is one in which the leads are substantially coplanar with the substrate, preserving the planar geometry of the substrate and thus providing a volumetrically efficient configuration.

As will be appreciated by those skilled in the art, the organization and assembly of integrated circuits of the type described above into more complex circuits is advantageously achieved by means of three-dimensional sub-assemblies of electrically interconnected circuits encapsulated to form a unitary block. These sub-assemblies, known in the art as modules, preferably perform a complete circuit function such as that of a four-bit-counter, for example.

Cast-encapsulated three-dimensional integrated circuit modules have been suggested in the prior art for integrated circuits. They suffer from the defects that potting material prevents the efficient dissipation of heat from the circuits in the module and increases its weight. Then too a potting compound makes replacement of individual integrated circuits substantially impossible or impractical since injury to components will usually occur if replacement is attempted. Furthermore, since it is difficult precisely to match the thermal expansion characteristics of the potting compound and the circuits, differential expansion in response to temperature often produces a stress which causes failure of a circuit in the module with resultant failure of the entire module.

Owing to the small size of each integrated circuit and the delicateness of its leads, which are easily bent or misaligned, integrated circuit modules have heretofore been necessarily hand assembled so that integrated circuit modules of the prior art are not only unsatisfactory in terms of weight, maintenance and heat dissipation, but also in terms of cost. Thus, many of the advantages inherent in integrated circuit components per se have heretofore been diminished when the circuits are assembled into modules.

We have invented an improved module for integrated circuits in which cast-encapsulation is eliminated, thus retaining the inherent advantages of integrated circuit assemblies. Our invention, further, provides for the support and protection of the integrated circuit and its leads during manufacture to enable automated assembly of modules.

One object of our invention is to provide a three-dimensional module which is not cast-encapsulated.

Another object of our invention is to provide a mount which facilitates the handling of integrated circuits.

Still another object of our invention is to provide a three-dimensional module in which defective circuits can be replaced without destroying the entire module.

Yet another object of our invention is to provide a module in which the circuit leads are accurately positioned so that they can be readily interconnected by a batch process such as vapor depositing a lead pattern or by other similar processes.

A further object of our invention is to provide a mount which accurately positions the coplanar leads of an integrated circuit in a module.

An additional object of our invention is to provide a mount which facilitates the packaging of integrated circuits in flat packages and permits testing thereof during the packaging process.

A still further object of our invention is to provide an improved integrated circuit module which is simple, more reliable and lighter than are modules of the prior art.

Other and further objects of our invention will appear from the following description.

In general our invention contemplates the provision of an integrated circuit module in which box-like frames or mounts supporting flat integrated circuits with their leads secured in grooves in one surface thereof are stacked and then bonded to encapsulate the circuits. The leads extend in accurate pattern to the outer surface of the stack where they may expeditiously be interconnected in a suitable manner known in the art. We provide a cover for protecting the uppermost circuit and a header equipped with circuit connecting pins adjacent the lowermost circuit, both of which form an integral part of our assembly.

In the accompanying drawings which form part of the instant specification and which are to be read in conjunction therewith and in which like reference numerals are used to indicate like parts in the various views.

Figure 1:
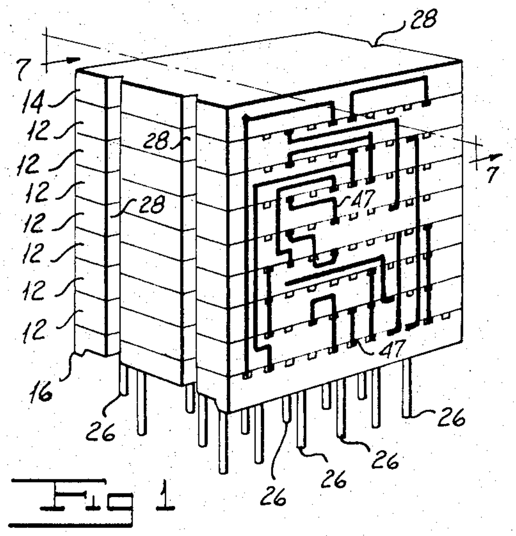
FIGURE 1 is a perspective view of an embodiment of our new module seen from one side.
Figure 2:
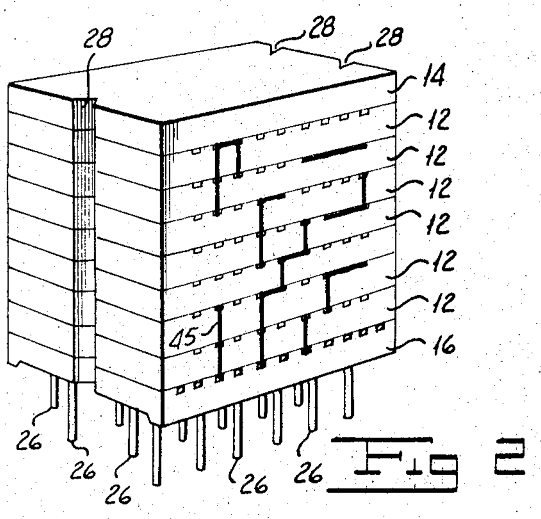
FIGURE 2 is a perspective view of the module shown in FIGURE 1 seen from the opposite side.
Figure 3:
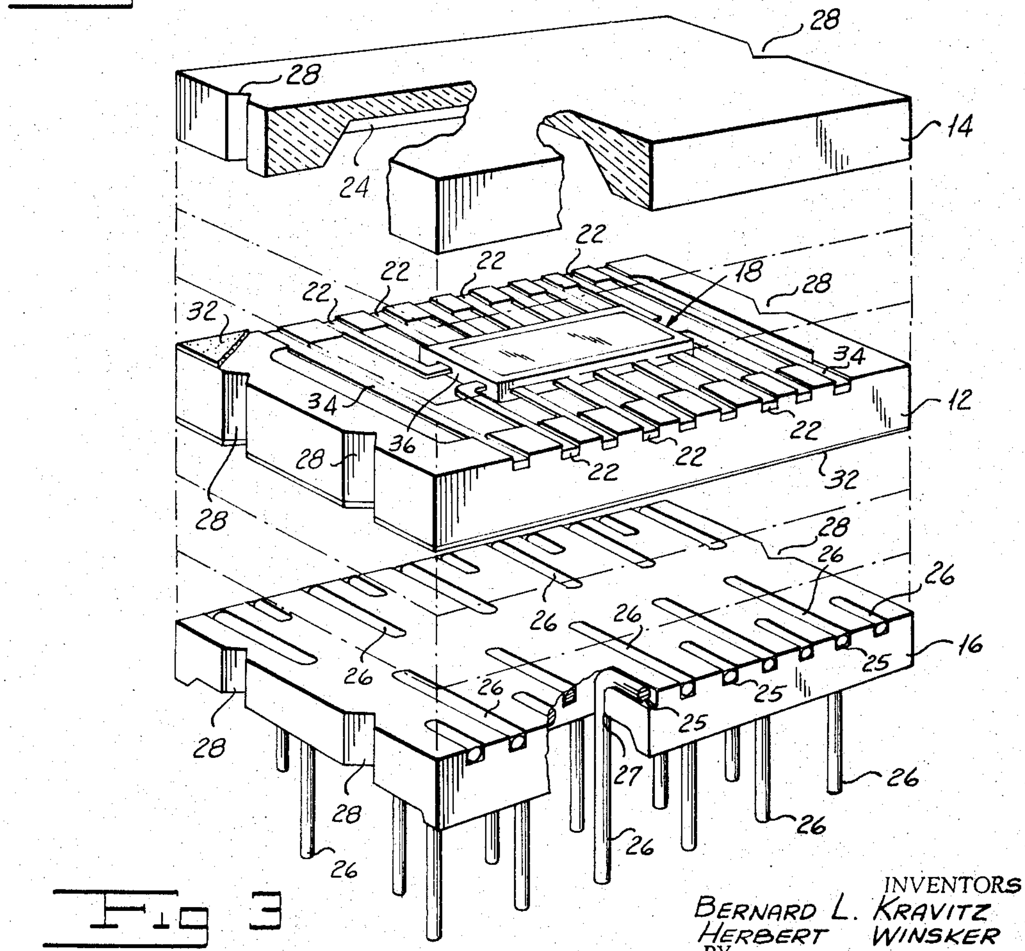
FIGURE 3 is a perspective view drawn on an enlarged scale of the module shown in FIGURES 1 and 2 with parts broken away and with other parts shown in phantom.
Figure 7:
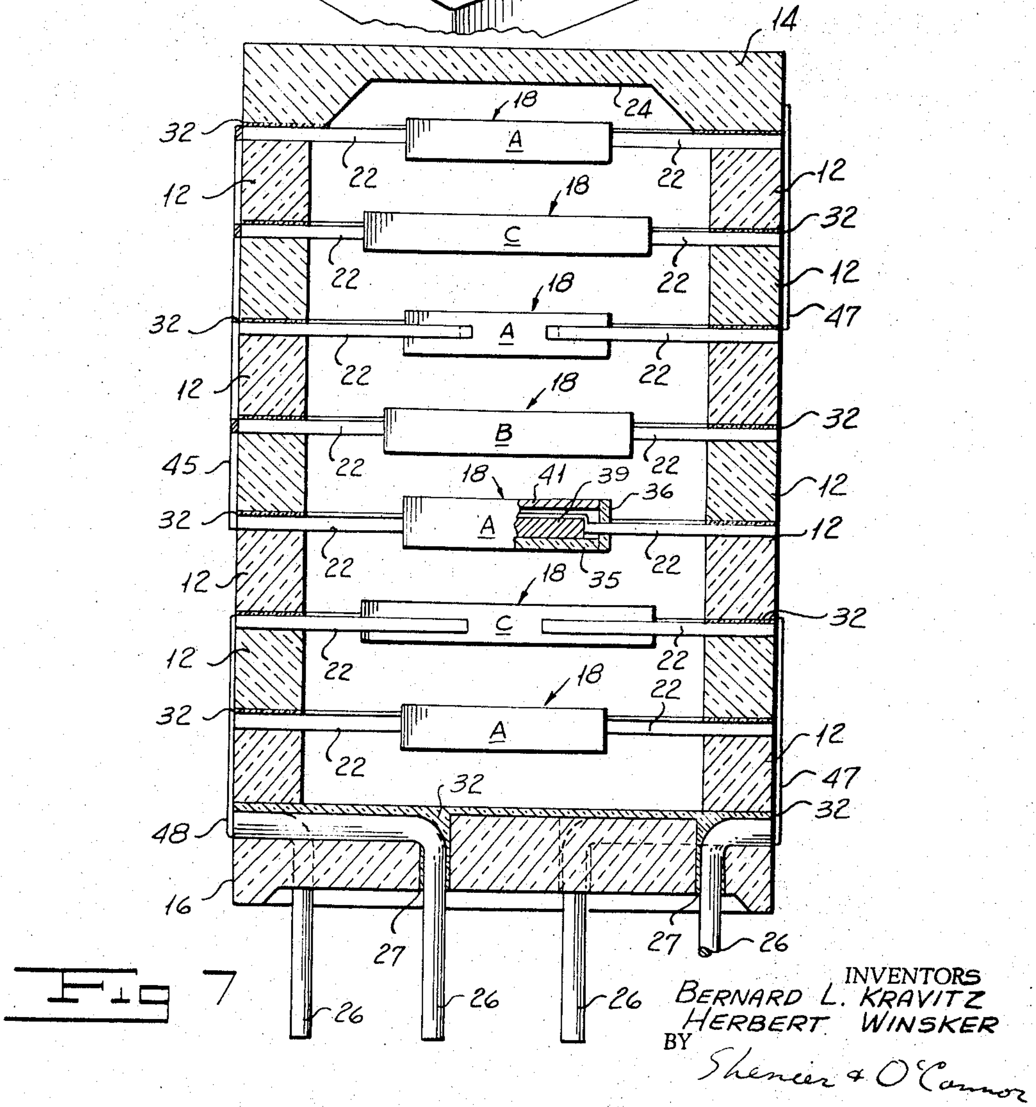
FIGURE 7 is a sectional view drawn on an enlarged scale taken along the line 7—7 of FIGURE 1.

More particularly, referring now to the drawings, FIGURES 1 and 2 show the exterior appearance of our new three-dimensional module which comprises a stack of box-like frames 12, a cover 14, a header 16 and layers of a structural adhesive 32 which bond the frames, header and cover together into a rigid housing or capsule. An integrated circuit, generally indicated by the reference numeral 18 in FIGURES 3 and 7, is mounted on each frame 12 with its coplanar leads 22 secured in accurately located rectangular rabbets or grooves 24 formed in the upper surface of the frame 12. An epoxy resin or other suitable adhesive material known in the art can be used for bonding the leads in the grooves. The leads 22 should be substantially flush with or slightly below the upper surface of the frame.

The cover 14 is a solid member that fits on the uppermost frame of the module to seal it. The underside of the cover 14 is recessed in the region 24 to provide space for the circuit 18 mounted on the uppermost frame of the module.

The header 16 has four rows of L-shaped leads 26 bonded in accurately positioned grooves 25 and holes 27. The frames 12 are made of any suitable insulating material known in the art as will be described in more detail hereinafter. The cover 14 and header 16 are conveniently made of the same material as the frames.

A typical module has from two to ten integrated circuits depending chiefly on the complexity of the overall function to be performed by the module and the particular integrated circuits used. Shift registers, operational amplifiers, four-bit counters, integrators, binary counters, ripple-through counters, and the like, or components of these are examples of the overall functions performed by a typical module. Advantageously, the dimensions of the frames 12 are such that integrated circuits which have slightly different dimensions can be mounted thereon, owing to the fact that several different types of integral circuit and integrated circuits from different sources of supply are often advantageously incorporated in a single module. For example, it is sometimes desirable to use in a single module circuits formed by depositing thin films on an insulating substrate and integrated circuits by depositing suitable dopants in discrete regions of a semiconducting silicon substrate. Hybrid combinations of various types of integrated circuits which are known to the art can be assembled in our module.

Referring to FIGURE 7, levels indicated by the letter "A" represent integrated circuits electrically designed specifically for the module, and packaged by bonding a particular circuit chip to a commercially available flat package. The level indicated by the letter "B" represents an integrated circuit of the type formed by depositing thin films on an insulating substrate. The levels indicated by the letter "C" represent integrated circuits or functional electronic blocks which are commercially available, off-the-shelf items. These circuits have the common characteristic of being flat and of having all leads lying generally in a plane. It will be noted, however, that the respective dimensions of each type vary slightly which is a typical situation encountered in the art.

We have ascertained that in the present state of the art a rectangular frame, whose walls are about 0.050 inch wide and 0.070 inch thick and enclose an area 0.450 inch by 0.300 inch, is satisfactory. The grooves 24 are typically disposed on 0.050 inch centers and are 0.018 inch wide and 0.006 inch deep. It will be understood that the particular dimensions of our frame are not critical and will be dictated by available integrated circuits.

Typically, we provide nine aligned grooves 24 on each side of the frame. A typical circuit has an aggregate of from three to sixteen leads 22 generally symmetrically arranged. In any grooves that are not used by a particular circuit 18 we place a feed through lead 34.

Figure 5:
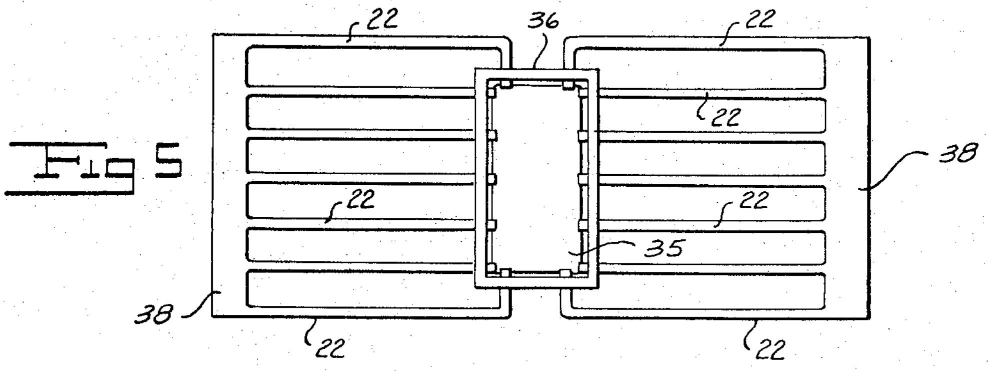
FIGURE 5 is a plan view of one type of flat package known to the prior art.
Figures 4, 6:
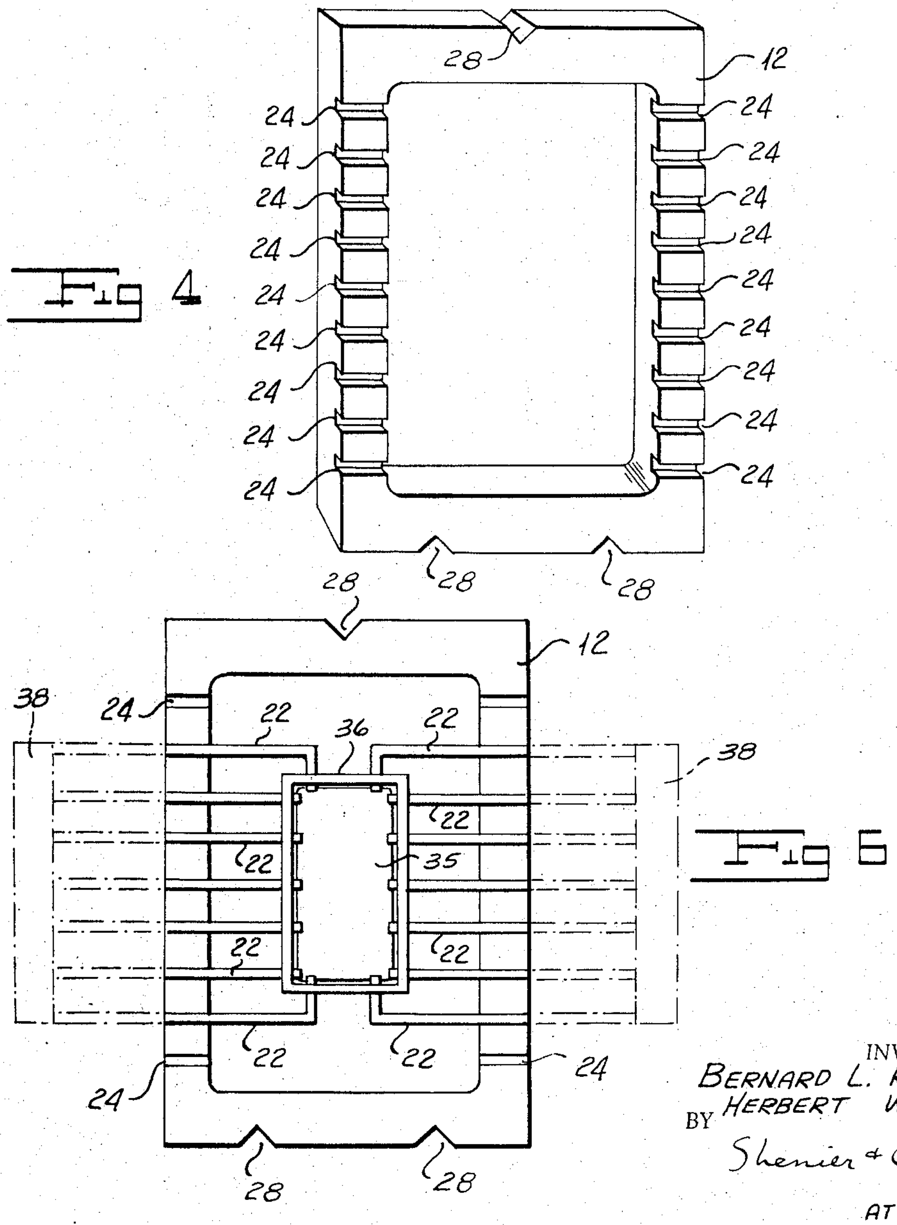
FIGURE 4 is a perspective view of an embodiment of our box frame.
FIGURE 6 is a plan view of a flat package of the type shown in FIGURE 5 secured to the box frame illustrated in FIGURE 4.

It will be appreciated tht we place a completely assembled circuit in the frame 12 with its leads in the frame channels 24. Our frame, in addition to facilitating the assembly of a module and housing the circuits in the assembled module, may also be advantageously used in the assembly of the integrated circuits. For example, referring to FIGURE 5, one type of flat package known in the art includes a shallow rectangular receptacle, the walls 36 of which are usually made of borosilicate glass and the base 35 of which is usually made of "Kovar" or a ceramic, depending upon the design requirements. "Kovar" is an alloy consisting of 20% nickel, 17% cobalt, 0.2% manganese, and the balance iron, and is manufactured and sold under that trademark by the Westinghouse Electric Company. Flat leads 22 (0.005 inch by 0.015 inch) pass through the borosilicate walls on 0.050 inch centers and are bonded thereto. As will be appreciated by those skilled in the art, both leads 22 and the mounting bases are commonly electrolytically gold plated to permit easy mounting of the integrated circuit chip or chips and lead attachment thereto. The leads 22 do not contact receptacle coating to prevent them from being short circuited. A thin, metal lead frame 38 integral with or secured to the leads 22 supports them and maintains their spacing. A completely packaged solid state circuit chip 39 is shown partially in section in FIGURE 7. Before mounting chip 39 in the receptacle 36, we place the flat package in our frame 12 and secure the leads 22 in the grooves 24 as shown in FIGURE 6. The temporary lead frame 38 is cut off after the package is secured in the frame 12 thus permitting testing of the integrated circuit during the packaging process. The circuit chip 39 is bonded in the receptacle, the leads 22 are connected to certain areas of the chip, and a cover 41 is bonded in place in any suitable known manner. Since these steps frequently require temperatures in excess of 400° C., the frame 12 preferably should be made of an insulating refractory material such as glass, glass-bonded mica, or a ceramic such as aluminum oxide. Organic materials and other insulating materials known in the art would not be satisfactory in this use of our frame if high temperatures are to be employed.

The frames 12 must be manufactured to very exacting tolerances in order to permit accurate positioning of the leads 22. Suitable frames can be made by the transfer molding of glass-bonded mica, or by oven glazing of a ceramic, or press-powder molding of glass, or other appropriate process known in the art. It will be readily appreciated that the package and frame can advantageously be manufactured as a single unit, if desired. Where relatively high temperatures are not involved in the use of the frames any suitable insulating material such as an appropriate synthetic resin known in the art may be employed.

After the circuits have been mounted in the frames 12, we coat the upper and lower surface of each frame 12 with a thin layer of a suitable structural adhesive 32, such as an epoxy resin or polyester resin, for example. The coating is carefully applied to insure a thin, evenly distributed layer which covers only the surface of the frame and does not flow over and cover the ends of the leads 22.

We bond leads 26 in grooves 25 and holes 27 formed in the header 16 by means of the structural adhesive 32, filling the holes and grooves completely with adhesive and covering the entire upper surface of header 16 with a thin layer of adhesive while leaving the ends of leads 26 exposed.

in assembling our module we stack the header 16, the box frame 12 on which the circuits 18 are mounted, and the cover 14 in a suitable jig. The header 16 is placed at bottom, and the frames 12 are stacked in a predetermined order, dictated by the module circuit design. Finally we place the cover 14 on uppermost frame 12 in the stack. Notches 28 in the frames 12, header 16 and cover 14 fit keying members on the jig, insuring that the frames are correctly oriented when they are placed in the jig. If desired, frames 12 can also be coded in any suitable manner, such as color coding, to assist in stacking them in the correct sequence.

We apply a carefully controlled pressure and may apply heat to the stack, causing the adhesive layers 32 to bond the frames 12 and the cover 14 and the header 16 into a rigid hermetically sealed shell. The pressure required for bonding may conveniently be obtained by placing a weight on the cover 14, or axially clamping the stack in a suitable vise. The required heat if used may be obtained by the use of radiant heaters. It will be appreciated that the resulting adhesive layers 32 joining frames together should be of a predetermined uniform thickness to insure that the leads 22 are accurately positioned at the surface of the shell.

Preferably, we establish a partial vacuum or provide an inert gas at reduced pressure within the sealed shell to prevent its internal pressure from becoming excessively high at elevated temperatures, and to prevent oxidation or contamination of the circuits and leads within the module. A convenient way to establish a partial vacuum or to furnish an inert atmosphere in the shell is to form the module within a vacuum chamber. We place the jig in a suitable chamber after stacking the header and frames before positioning the cover 14. Then we evacuate the chamber. The cover is then placed on the uppermost frame while maintaining the vacuum in the chamber. The bonding of the header, the frames, and the cover together is then accomplished by applying pressure and heat if desired as previously described. If an inert atmosphere is desired within the module we admit a small amount of inert gas, such as argon, into the evacuated chamber before placing cover 14 in position.

It should be noted that for some applications the module need not be hermetically sealed, in which case openings can be provided in the cover 14 to permit the passage of air to and from the interior of the module.

Figure 8:
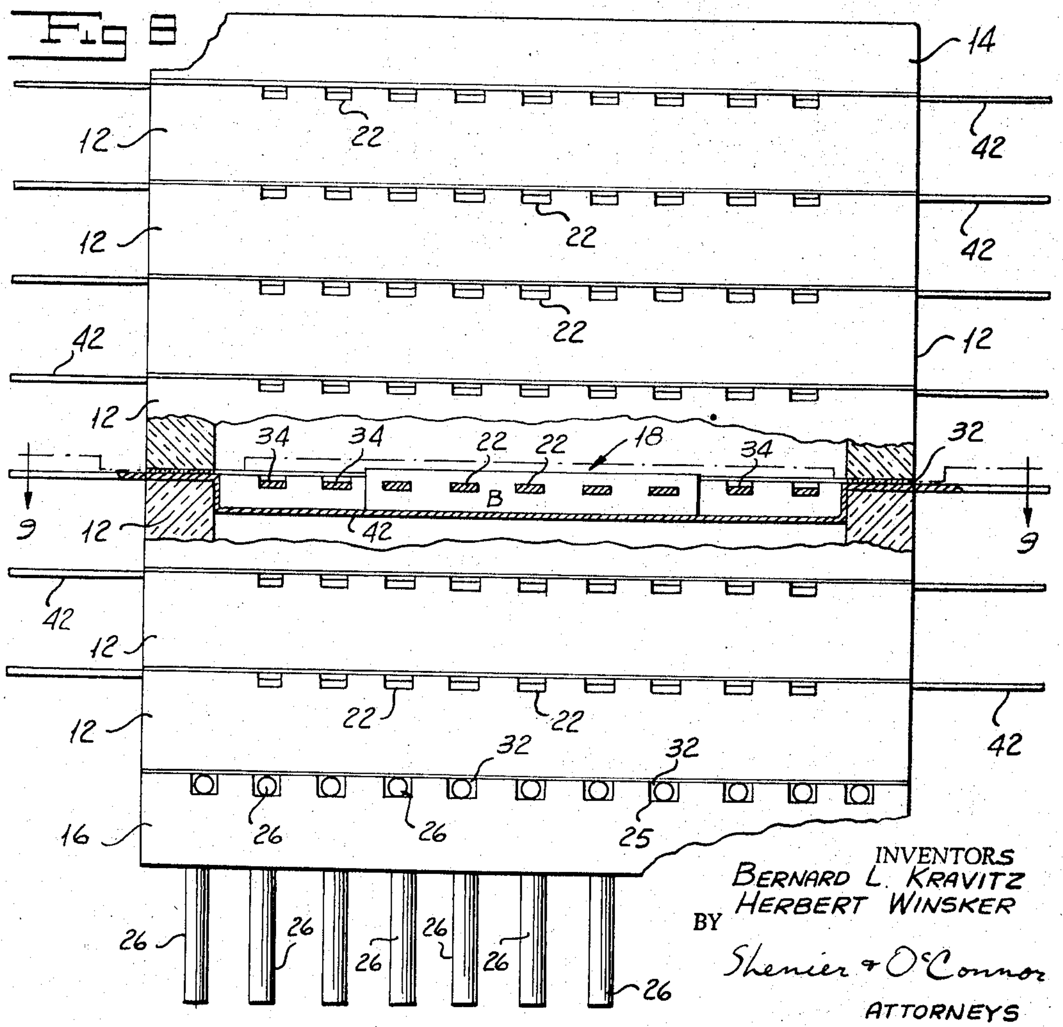
FIGURE 8 is a side elevation, partially in section, of another embodiment of our module.

The leads 22 extend to the outer surface at two opposite sides of the assembled shell and form a pattern of straight rows and columns on each side, as can be seen in FIGURES 1, 2 and 8. The leads 22 on one side are interconnected by predetermined conductors 45 and on the other side by predetermined conductors 47 according to the overall module circuit. Advantageously the conductors 45 and 47 are coated with a thin lacquer coating to protect them from mechanical abrasion and oxidation.

Because each lead 22 is accurately positioned at a predetermined location on the face of the shell, the interconnecting conductors 45 and 47 can advantageously be formed by an automated or semi-automated hatch process. For example a frame-supported, preformed interconnection pattern may be conductively attached to the leads 22. Alternatively interconnections may be deposited on the shell in a pattern either by depositing the interconnections through a mask to form the pattern directly or by depositing a conductive film over the entire interconnecting surface and forming the pattern by photoetching techniques known in the art. The conductors 45 and 47 interconnect the leads 22 with the L-shaped leads 26, which are transitional connections, permitting the module to be connected to other modules and other equipment at its base.

The leads 22 can also be interconnected by wire wrapping known in the art. If this interconnection technique is to be used the leads 22 are permitted to extend beyond the edges of the frames 12 instead of cutting them flush with the outer edge as shown in FIGURE 6.

The feed through leads 34 permit the interconnection of leads at opposite surfaces of the module. If needed, dummy frames 12 which have only feed through leads 34 can be incorporated in the module.

Figure 9:
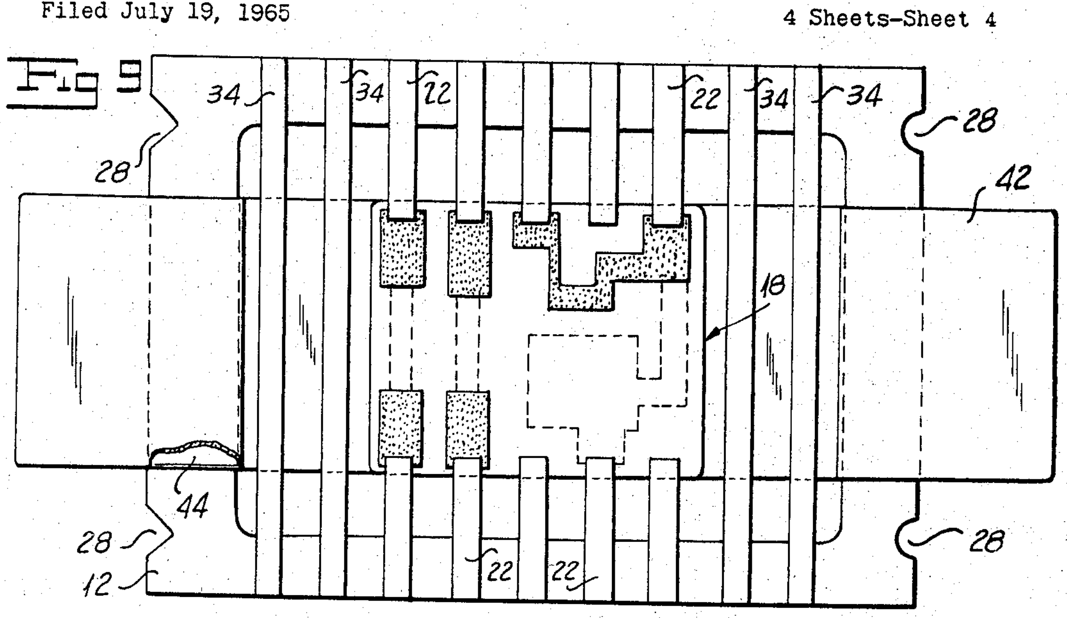
FIGURE 9 is a sectional view taken along the line 9—9 of FIGURE 8.

FIGURES 8 and 9 show an embodiment of our invention that has a number of thin metal plates 42 for dissipating heat generated by the circuits. It should be noted that, owing to their low power, digital circuits do not ordinarily require any heat dissipating plates or other auxiliary heat dissipating apparatus. The use of heat dissipating plates for certain other circuits, on the other hand, is often advantageous where heat is generated at greater rates.

The heat conducting plates 42 extend between the ends of the frames 12, passing beneath and contacting the substrate circuits 18. Each plate 42 is secured in a saddle 44 at each end of the frame 12 by an epoxy glue or any other suitable means known in the art. Preferably the upper surface of plate 42 is flush with the upper surface of frame 12. Usually, the plates 42 extend beyond the surface of the module, providing thermal radiating fins which can be cooled by convection. If desired, however, the ends of plates 42 can be flush with the surface of the module and connected to a suitable heat sink. It should be noted that the plates 42 provide some electrostatic shielding between circuits in the module.

An alternative method for dissipating heat from the module which can sometimes be used, if desired, is to fill the void within the shell with a metal oxide that is electrically insulating but thermally conducting.

It should be noted that the substrate circuit 18 shown in plan in FIGURE 9 is of the type in which the components are formed by depositing thin films on an insulating substrate. Ordinarily this surface of such circuit is coated with a suitable passivating material and no packaging other than the module itself is usually required.

Figure 10:
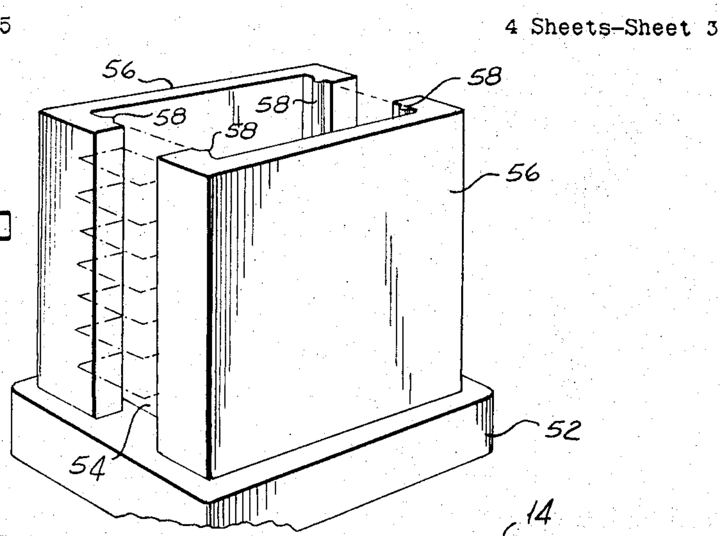
FIGURE 10 is a perspective view of a jig which may be used in assembling our new module.

FIGURE 10 shows a suitable jig in which the header 16, the frames 12 and the cover 14 can be stacked for assembling our module. It has a pedestal 52 on which the header 16 is placed with its leads 26 extending through an opening 54. We affix upstanding walls 56 to the pedestal 52. Keys 58 formed on each end of the walls 56 engage corresponding notches 28 on the header 16, cover 14, and frames 12. Slots cut in the end walls of the jig shown in FIGURE 10 accommodate the plates 42. The embodiment of our invention shown in FIGURES 8 and 9 uses a slightly different arrangement of keying notches 28 than the embodiment shown in FIGURES 1 to 7 because of the plates 42. The particular keying members 58 shown in FIGURE 10 are adapted to engage the notches shown in the embodiment of FIGURES 8 and 9.

In summary, we mount our circuit on a rigid, modular box frame which maintains the alignment of its input and output leads and facilitates automated assembly of these circuits into more complex circuits. We stack these frames and bond them together forming a shell thereof which shell encapsulates the circuits. The input and output leads are embedded in and extend to the outer surface of the wall of the shell in a predetermined matrix so that the leads can be expeditiously interconnected by a suitable batch process.

It will be appreciated by those skilled in the art that our invention is not limited to integrated circuits. Microminiature circuits which are known in the art can be mounted on our frames and incorporated in a module which includes integrated circuits or other microminiature circuits. Moreover, individual components such as miniature inductor coils can also be advantageously mounted on a frame and incorporated in a module of integrated circuits.

Thus, it will be seen, we have accomplished the objects of our invention. We have provided a three-dimensional module which is not cast-encapsulated. Our box frame facilitates the handling of substrate circuits and accurately positions the circuit leads in the module. Our frame facilitates packaging of solid state circuits and permits them to be tested during the packaging process. Defective integrated circuits in a module can be replaced by cutting or breaking a frame out of a module and replacing it with a new framed circuit without destroying the entire module. Owing to the fact that the leads of each circuit are accurately positioned in the module we are able to interconnect them by a suitable batch process such as vapor deposition or printed circuit techniques. Our improved module is simpler, more reliable and lighter than are modules of the prior art.

It will be understood that certain features and subcombinations are of utility and may be employed without reference to other features and subcombinations. This is contemplated by and is within the scope of our claims. It is further obvious that various changes may be made in details within the scope of our claims without departing from the spirit of our invention. It is therefore to be understood that our invention is not to be limited to the specific details shown and described.

Having thus described our invention, what we claim is:

1. A module comprising a plurality of mounts forming openings, a cover plate, a header plate, a plurality of flat circuits each of which has a plurality of coplanar leads, means securing said circuits respectively to said mounts in said openings, means adhesively joining said mounts and said cover plate and said header plate to form a hollow hermetic housing therefrom for encapsulating said circuits, said housing having an exterior surface formed by said mounts, said leads extending to said exterior surface, and means formed on said surface electrically interconnecting certain of said leads.

2. A module as in claim 8 including means disposed within said housing for conducting heat away from said circuits.

3. An assembly of generally planar circuits each having a plurality of generally coplanar leads including in combination a plurality of frames of insulating material, said frames forming openings, means mounting each of said circuits in a respective frame opening with its leads extending to the outer edge of the frame, and an insulating adhesive for assembling said frames in stacked relationship, said adhesive disposed around said frames to form a hollow hermetic housing with said leads extending to the outer surface of said housing.

4. A module comprising a stack of frames, each of said frames forming an opening, a plurality of flat circuits each of which has a plurality of coplanar leads, means securing said circuits respectively to said frames in said openings, an adhesive extending around and confined between adjacent surfaces of said frames joining said frames together to a form a hollow housing for hermetically encapsulating said circuits, said housing having an exterior surface formed by said frames, said leads being embedded between said adjacent frame surfaces and extending to said housing exterior surface, and a conductive pattern on said housing exterior surface electrically interconnecting certain of said leads.

5. A module comprising in combination a stack of contiguous hollow mounts, a plurality of flat circuits, each of said circuits secured to each of said mounts respectively, a continuous layer of insulating adhesive hermetically joining said mounts together around their interfaces to form a sealed hollow housing thereof which encapsulates said circuits, and means electrically interconnecting said circuits.

6. An integrated circuit module including in combination, a plurality of flat circuits each having a plurality of generally coplanar leads preformed with a certain interlead spacing, a plurality of frames of insulating material, each of said frames having an opening formed by a wall, a plurality of channels extending through the wall of each of said frames, said channels having a spacing corresponding to said interlead spacing, said circuits being disposed within the respective frame openings with said leads disposed in said channels and with the leads of each circuit extending to the periphery of the associated frame, a cover plate, a header plate, means for bonding said cover plate and said frames and said header plate in stacked relationship to form a hollow hermetically sealed housing having a wall formed by said frame walls and a pattern of conductive material on the external surface of said housing wall for connecting certain of said leads.

7. A module as in claim 6 in which said frames are formed of refractory material.

8. A module comprising a stack of frames, a cover plate, a base plate, a plurality of flat circuits each of which has a component and a plurality of coplanar leads, means securing said circuits respectively within said frames with the leads of each circuit extending to the peripheral surface of the corresponding frame, means for adhesively joining together said cover plate and said frames and said base plate in superposed relationship to form a hollow hermatic housing for encapsulating said circuits, said frames forming a housing wall and said frame peripheral surface forming an exterior housing surface, said leads embedded in said wall and extending to said exterior surface and means on said exterior surface interconnecting certain of said leads.

9. In an integrated circuit module a plurality of flat circuits, each having a plurality of coplanar leads with a certain interlead spacing, a plurality of frames of insulating material, each of said frames having a wall, a plurality of channels extending through the wall of each of said frames, said channels having a spacing corresponding to said interlead spacing, said circuits being disposed within the respective frames with said leads disposed in said channels and with said leads of each circuit extending to the periphery of the associated frame, means assembling said frames in superposed relationship and a pattern of conductive material on the external surfaces of the frame walls for connecting certain of said leads.

References Cited

UNITED STATES PATENTS

| | | |
|---|---|---|
| 2,786,969 | 3/1957 | Blitz. |
| 3,243,661 | 3/1966 | Ullery. |
| 3,271,625 | 9/1966 | Caracciolo. |
| 2,821,669 | 1/1958 | Christian. |
| 3,029,495 | 4/1962 | Doctor. |
| 3,212,047 | 10/1965 | McDonough. |
| 3,239,719 | 4/1966 | Shower. |

ROBERT K. SCHAEFER, *Primary Examiner.*

D. SMITH, *Assistant Examiner*